(12) United States Patent
Hirano

(10) Patent No.: US 9,069,350 B2
(45) Date of Patent: Jun. 30, 2015

(54) PROCESSING APPARATUS WITH CONVEYER AND CONTROLLER TO OUTPUT REQUEST SIGNAL AND STOP INSTRUCTION SIGNAL

(75) Inventor: Shinichi Hirano, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 937 days.

(21) Appl. No.: 11/957,568

(22) Filed: Dec. 17, 2007

(65) Prior Publication Data

US 2008/0143996 A1 Jun. 19, 2008

(30) Foreign Application Priority Data

Dec. 18, 2006 (JP) .................... 2006-340577

(51) Int. Cl.
G05B 19/418 (2006.01)
G03F 7/20 (2006.01)
H01L 21/67 (2006.01)
H01L 21/677 (2006.01)

(52) U.S. Cl.
CPC ........ G05B 19/41815 (2013.01); G03F 7/7075 (2013.01); G05B 2219/31261 (2013.01); G05B 2219/45031 (2013.01); H01L 21/67253 (2013.01); H01L 21/67259 (2013.01); H01L 21/67745 (2013.01)

(58) Field of Classification Search
CPC ............ G03F 7/7075; G05B 19/41815; G05B 19/4061
USPC ............ 355/72, 77, 53; 198/134.01; 700/230, 700/258
See application file for complete search history.

(56) References Cited

U.S. PATENT DOCUMENTS

| 6,059,507 A * | 5/2000 | Adams .......................... 414/217 |
| 6,698,944 B2 * | 3/2004 | Fujita ............................. 396/611 |
| 7,095,022 B2 | 8/2006 | Nakasuji et al. |

(Continued)

FOREIGN PATENT DOCUMENTS

| JP | 7-176588 A | 7/1995 |
| JP | 10067420 A | 3/1998 |

(Continued)

OTHER PUBLICATIONS

Korean Office Action issued on Feb. 20, 2009 for corresponding Korean Patent Application No. 10-2007-0132915 (No English translation provided).

(Continued)

*Primary Examiner* — Chia-How Michael Liu
(74) *Attorney, Agent, or Firm* — Rossi, Kimms & McDowell LLP

(57) ABSTRACT

A processing apparatus includes a unit processing an object, a first conveyer to perform conveyance of the object between the unit and a station arranged between an external apparatus and the unit, the external apparatus including a second conveyer to hold the object with a hand thereof to perform conveyance of the object to or from the station, and a controller to output a request signal and a stop instruction signal. The request signal requests the external apparatus to perform the conveyance by the second conveyer, and is output before the processing apparatus becomes a state to allow the second conveyer to perform the conveyance, and the stop instruction signal instructs the external apparatus to stop the hand and is output based on a state of the processing apparatus after an output of the request signal and before the conveyance of the second conveyer.

18 Claims, 14 Drawing Sheets

(56) References Cited

U.S. PATENT DOCUMENTS

| | | |
|---|---|---|
| 2001/0053291 A1 | 12/2001 | Fujita |
| 2003/0231289 A1 | 12/2003 | Fujita |
| 2006/0147201 A1 | 7/2006 | Asano et al. |
| 2006/0182536 A1* | 8/2006 | Rice et al. .................. 414/217 |

FOREIGN PATENT DOCUMENTS

| | | |
|---|---|---|
| JP | 10-199960 A | 7/1998 |
| JP | 2002043208 A | 2/2002 |
| JP | 2002-075853 | 3/2002 |
| JP | 2004260129 A | 9/2004 |
| JP | 2005209900 A | 8/2005 |
| KR | 10-2006-0063683 A | 6/2006 |
| TW | 200627575 A | 8/2006 |
| WO | 03017344 A1 | 2/2003 |

OTHER PUBLICATIONS

Office action of corresponding Taiwanese application No. 096147478, dated Mar. 29, 2011. Partial English abstract provided.
Office Action issued Oct. 21, 2011 for corresponding JP2006340577.
JP Office Action issued Sep. 24, 2012 for corresponding JP 2006-340577.
Office Action issued Aug. 22, 2008 for JP 2006-269021 (Cited in related US 2008/0079925).
Office Action issued Feb. 20, 2009 for KR 10-2007-0096323 (Cited in related US 2008/0079925).

* cited by examiner

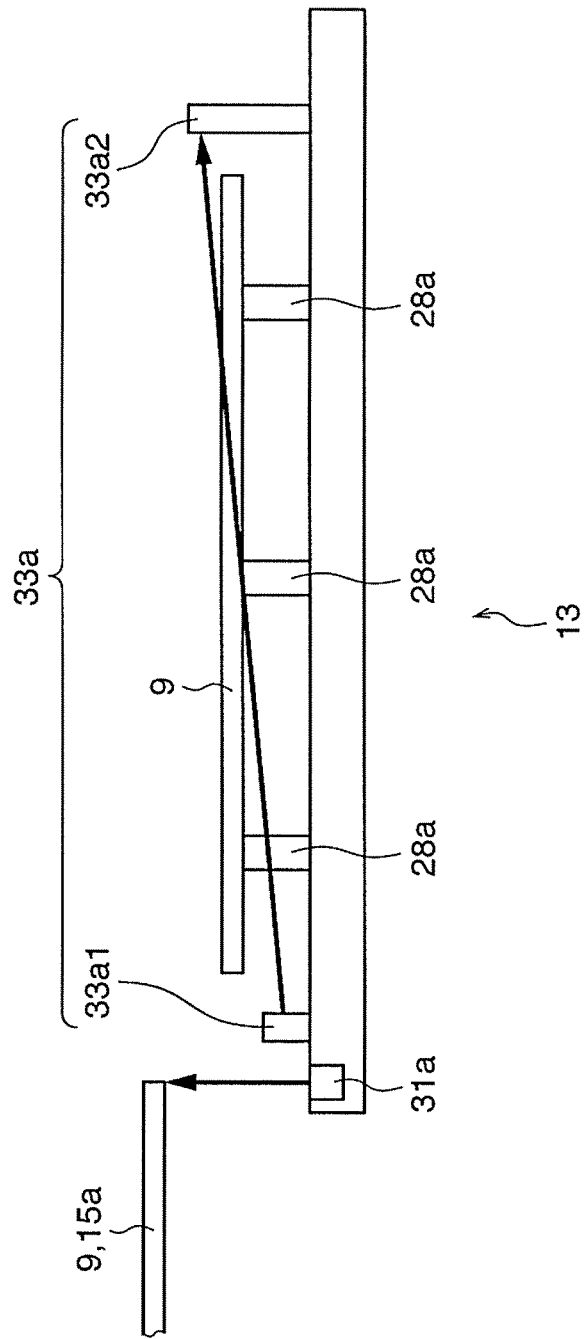

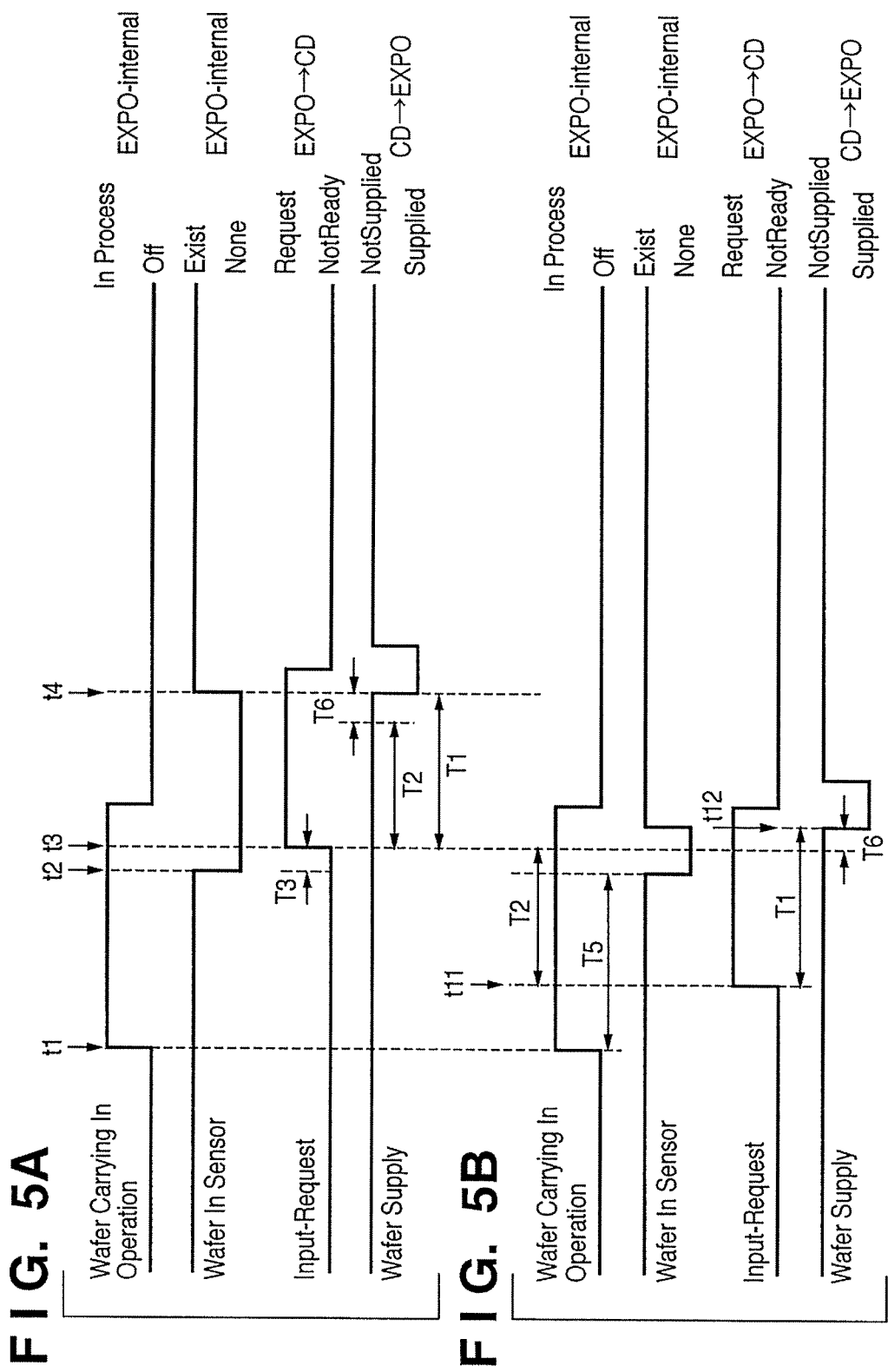

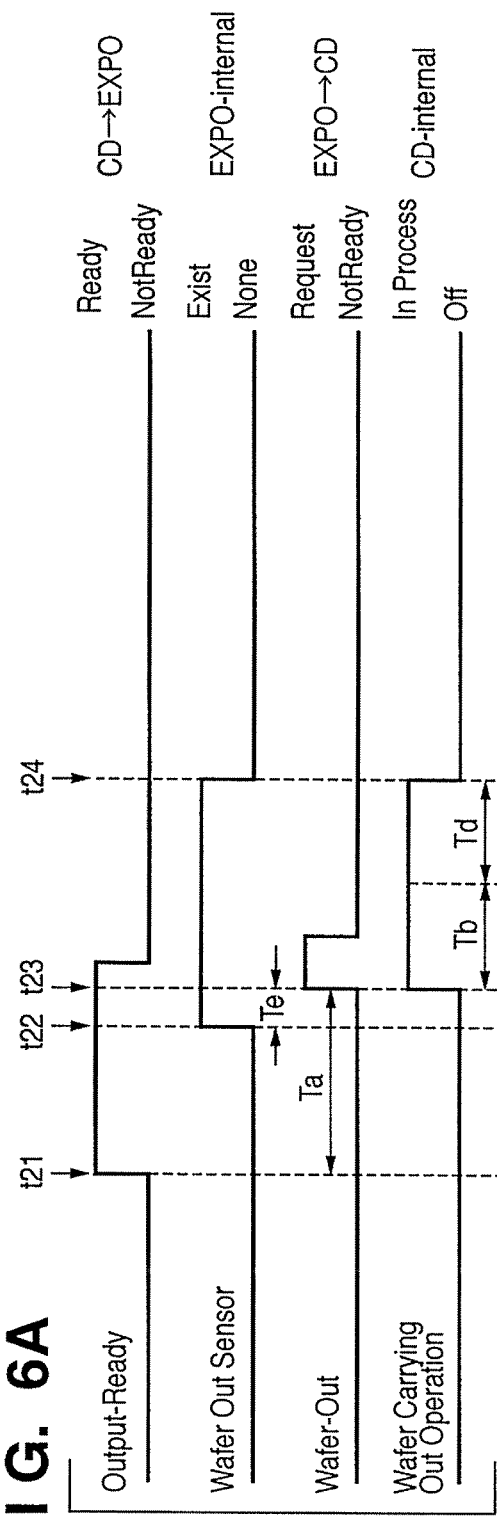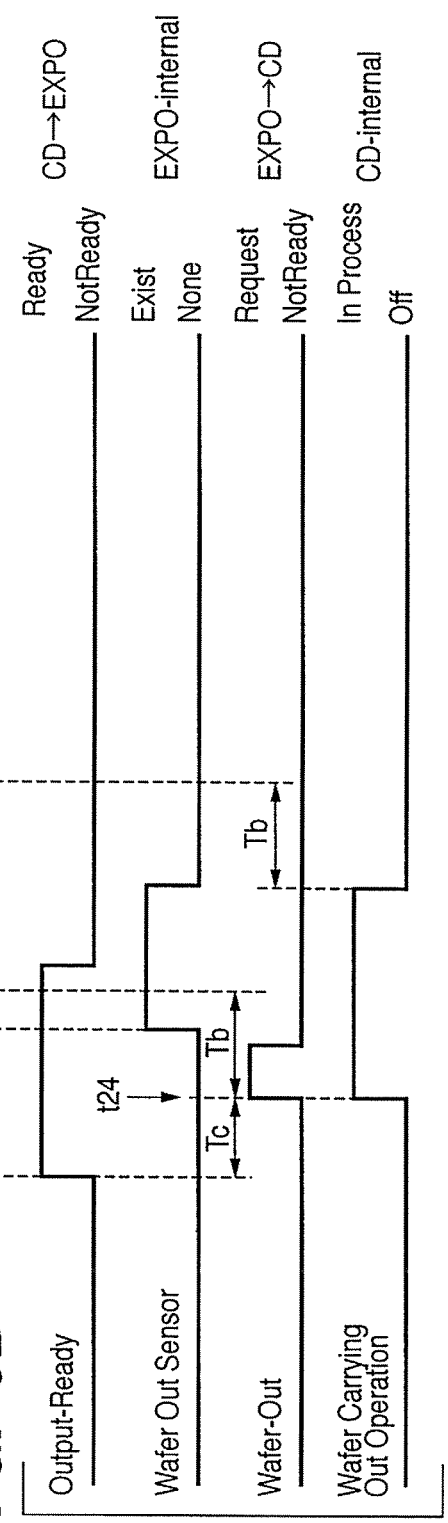

F I G. 12
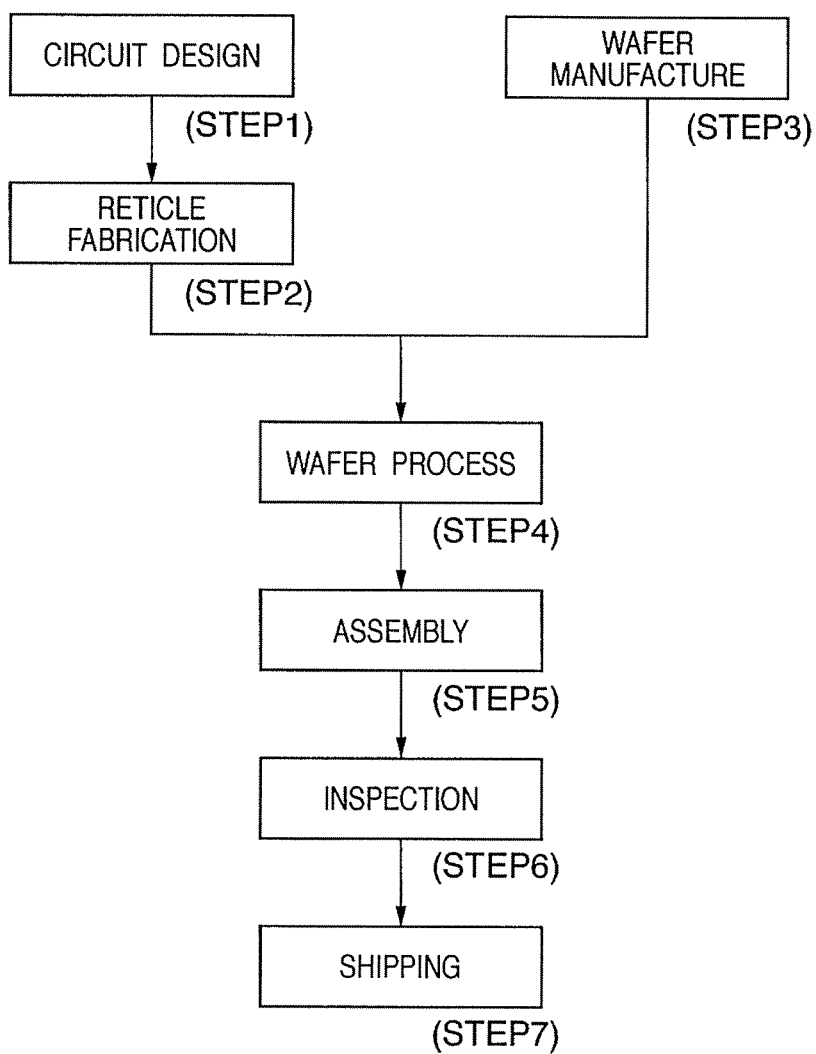

PROCESSING APPARATUS WITH CONVEYER AND CONTROLLER TO OUTPUT REQUEST SIGNAL AND STOP INSTRUCTION SIGNAL

BACKGROUND OF THE INVENTION

1. Field of the Invention

The present invention relates to a processing apparatus and, more particularly, to a processing apparatus including a processing unit which processes an object.

2. Description of the Related Art

An exposure apparatus to manufacture a device such as a semiconductor device is usually used by connecting it to a coating and developing apparatus. A wafer coated with a photosensitive agent is transferred between the exposure apparatus and coating and developing apparatus. An inlet/outlet station is inserted between the exposure apparatus and coating and developing apparatus. The exposure apparatus removes a wafer placed on the inlet/outlet station, and requests the coating and developing apparatus to supply the next wafer at the timing when the exposure apparatus becomes capable of receiving the next wafer.

When transferring an exposed wafer to the coating and developing apparatus, the exposure apparatus places the wafer on the inlet/outlet station and requests the coating and developing apparatus to remove it from the inlet/outlet station at the timing when the coating and developing apparatus becomes capable of receiving the wafer.

According to the above scheme of requesting the coating and developing apparatus to supply the next wafer at the timing when the exposure apparatus becomes capable of receiving the next wafer, the coating and developing apparatus operates a conveyer upon reception of this request. Assume that the time necessary for the coating and developing apparatus to actually place the wafer on the inlet/outlet station after it receives a wafer supplying request is a time T. The exposure apparatus cannot receive the next wafer until the time T elapses since the timing when it can receive the next wafer.

According to the above scheme of requesting the coating and developing apparatus to remove the wafer from the inlet/outlet station at the timing when the coating and developing apparatus becomes capable of receiving the wafer, the coating and developing apparatus operates the conveyer upon reception of this request. Assume that the time necessary for the coating and developing apparatus to remove the wafer from the inlet/outlet station after it receives a wafer removing request is a time T. The exposure apparatus cannot place the next wafer on the inlet/outlet station until the time T elapses since the timing when the coating and developing apparatus becomes capable of receiving the wafer.

SUMMARY OF THE INVENTION

The present invention is made upon recognition of the above background, and has as its exemplary object to improve throughput of a processing apparatus including a processing unit which processes an object.

According to the present invention, there is provided a processing apparatus including a processing unit which processes an object is disclosed. The apparatus comprises a first conveyer configured to perform conveyance of the object between the processing unit and a station arranged between an external apparatus and the processing unit, wherein the external apparatus includes a second conveyer configured to hold the object with a hand thereof to perform conveyance of the object to the station or from the station, and a controller configured to output a request signal and a stop instruction signal, wherein the request signal is a signal for requesting the external apparatus to perform the conveyance by the second conveyer, and is output before the processing apparatus becomes a state to allow the second conveyer to perform the conveyance, and the stop instruction signal is a signal which instructs the external apparatus to stop the hand and is output based on a state of the processing apparatus after an output of the request signal and before the conveyance of the second conveyer.

The present invention can improve, for example, the processing throughput in a processing apparatus including a processing unit which processes an object.

Further features of the present invention will become apparent from the following description of exemplary embodiments with reference to the attached drawings.

BRIEF DESCRIPTION OF THE DRAWINGS

FIG. 3A is a side view showing an arrangement of a carrying-in portion in an inlet/outlet station;

FIGS. 5A and 5B are timing charts showing operation examples when carrying in a wafer from a coating and developing apparatus to an exposure apparatus;

FIGS. 6A and 6B are timing charts showing operation examples when carrying out the wafer from the exposure apparatus to the coating and developing apparatus;

FIG. 12 is a flowchart showing the procedure of an overall semiconductor device manufacturing process.

DESCRIPTION OF THE EMBODIMENTS

Preferred embodiments of the present invention will be described with reference to accompanying drawings.

Figure 1:
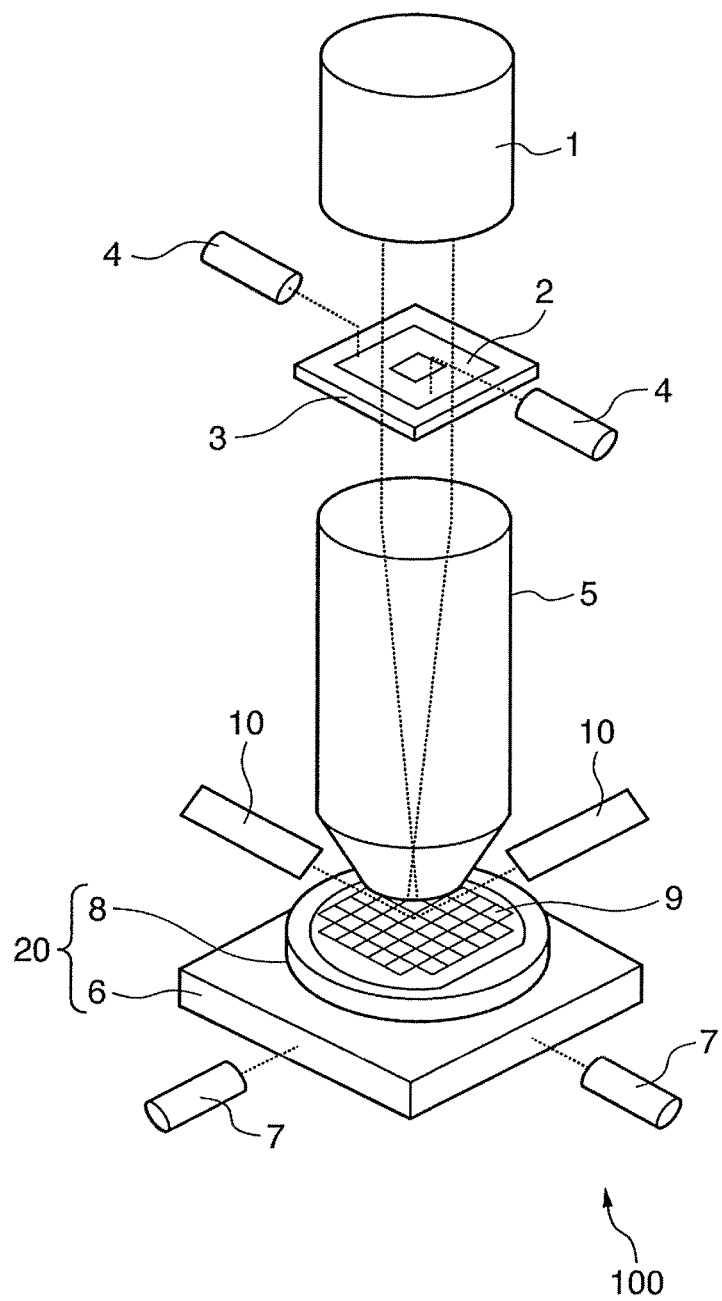
FIG. 1 is a view showing the schematic arrangement of the main body portion of an exposure apparatus according to a preferred embodiment of the present invention.

FIG. 1 is a view showing the schematic arrangement of the main body portion of an exposure apparatus according to a preferred embodiment of the present invention. An exposure apparatus 100 according to the preferred embodiment of the present invention comprises an illumination device 1 including a light source, a reticle stage 3 which holds a reticle 2 having a pattern formed on it, and reticle position measurement units 4 which measure the position of the reticle 2 held by the reticle stage 3. The exposure apparatus 100 also comprises a projection optical system 5 and a stage device 20 which positions a wafer (substrate) 9 coated with a photosensitive agent. The stage device 20 includes an X-Y stage 6 which positions the wafer 9 in the X and Y directions, and a Z stage 8 to position the wafer 9 in the Z direction. The exposure apparatus 100 also comprises laser interferometers 7 which measure the position of the X-Y stage 6 in the X and Y directions, and focus units 10 which measure the position of the wafer 9 in the Z direction. The pattern formed on the reticle 2 is projected onto the wafer 9 on the Z stage 8 through the projection optical system 5 to form a latent image pattern on the photosensitive agent applied to the wafer 9. The latent image pattern is developed into a physical pattern by a developing process.

Figure 2:
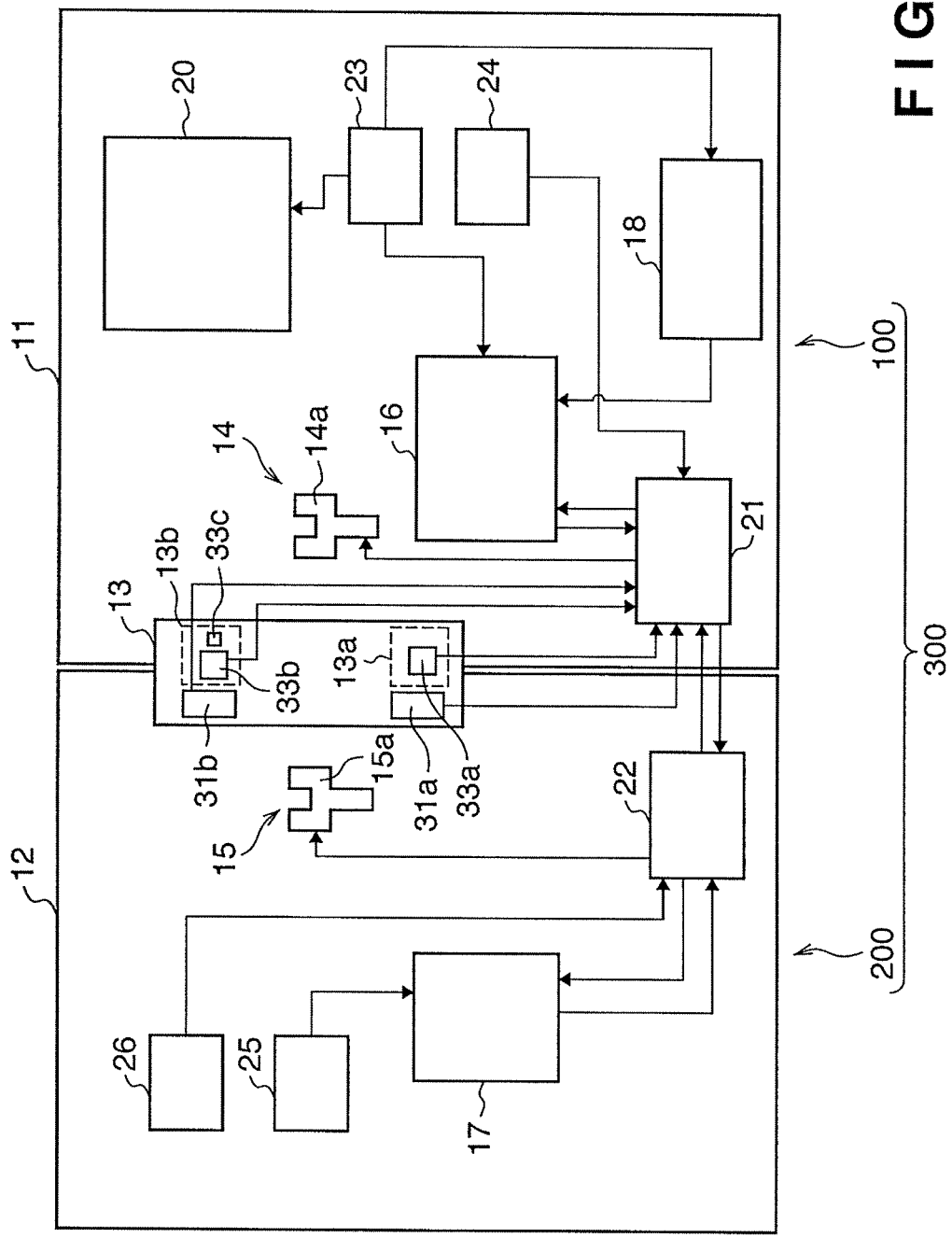
FIG. 2 is a view showing the schematic arrangement of a lithography system according to a preferred embodiment of the present invention.

FIG. 2 is a view showing the schematic arrangement of a lithography system according to a preferred embodiment of the present invention. A lithography system 300 shown in FIG. 2 includes the exposure apparatus (processing apparatus) 100 having the main body portion shown in FIG. 1, and a coating and developing apparatus 200. The exposure apparatus 100 comprises an exposure chamber 11. The main body portion of the exposure apparatus 100, that is, an exposure unit (an example of the processing unit), is arranged in the exposure chamber 11. FIG. 2 shows only the stage device 20 as the main body portion of the exposure apparatus 100 for the sake of simplification. A first conveyer 14 serving as a conveyer on an exposure apparatus side, an exposure apparatus controller 16, and an input/output device 18 serving as a user interface are arranged in the exposure chamber 11. The first conveyer 14 includes a hand 14a which holds the wafer 9 as a processing target object. A main power supply 23, a sub-power supply 24, and a first conveyer controller 21 which controls the first conveyer 14 are also arranged in the exposure chamber 11. The main power supply 23 supplies power to at least the main body portion, the exposure apparatus controller 16, and the input/output device 18 of the exposure apparatus 100. The sub-power supply 24 supplies power to the first conveyer controller 21. The sub-power supply 24 is configured to continue power supply to a power supply target even if power supply to the power supply target by the main power supply 23 is interrupted. More specifically, the sub-power supply 24 can include, for example, a secondary cell. When the main power supply 23 is in the normal state, the sub-power supply 24 charges the secondary cell with power supplied from the main power supply 23. When power supply by the main power supply 23 is interrupted due to an abnormality in the main power supply 23, a power failure, or the like, the sub-power supply 24 supplies power to the power supply target with the secondary cell.

The coating and developing apparatus 200 includes a coating and developing apparatus chamber 12. The main body portion (including a coating and developing apparatus unit having the functions of applying the photosensitive agent to the wafer and developing an exposed wafer) of the coating and developing apparatus 200 is mounted in the coating and developing apparatus chamber 12. A second conveyer 15 serving as a conveyer on a coating and developing apparatus side, and a coating and developing apparatus controller 17 are arranged in the coating and developing apparatus chamber 12. A main power supply 25, a sub-power supply 26, and a second conveyer controller 22 which controls the second conveyer 15 are also mounted in the coating and developing apparatus chamber 12. The second conveyer 15 includes a hand 15a which holds the wafer 9 as the processing target object. The main power supply 25 supplies power to at least the main body portion and the coating and developing apparatus controller 17 of the coating and developing apparatus 200. The sub-power supply 26 supplies power to the second conveyer controller 22. The sub-power supply 26 is configured to continue power supply to the power supply target even when power supply to the power supply target by the main power supply 25 is interrupted. More specifically, the sub-power supply 26 can include, for example, a secondary cell. When the main power supply 25 is in the normal state, the sub-power supply 26 charges the secondary power with the power supplied from the main power supply 25. When power supply by the main power supply 25 is interrupted due to an abnormality in the main power supply 25, a power failure, or the like, the sub-power supply 26 supplies power to the power supply target with the secondary cell.

The first conveyer 14 receives a wafer that the second conveyer 15 conveyed to a carrying-in portion 13a of an inlet/outlet station 13, and conveys it to the stage device 20 of the exposure unit. The first conveyer 14 conveys the exposed wafer to a carrying-out portion 13b of the inlet/outlet station 13. The first conveyer 14 may convey the wafer to the stage device 20 via a wafer alignment unit (not shown; in another example of the processing unit). A plurality of wafer conveyers may be arranged in the exposure chamber 11.

In the following description, "carrying-in" refers to the entire or part of the operation of conveying the wafer from the coating and developing apparatus 200 to the main body portion (stage device 20) of the exposure apparatus 100 via the carrying-in portion 13a of the inlet/outlet station 13. "Carrying-out" refers to the entire or part of the operation of conveying the wafer from the exposure apparatus 100 to the main body portion of the coating and developing apparatus 200 via a carrying-out portion 13b of the inlet/outlet station 13.

A "supplying request" (conveying-in request) is a request sent from the exposure apparatus 100 to the coating and developing apparatus 200, requesting the second conveyer 15 to supply the wafer to the carrying-in portion 13a of the inlet/outlet station 13. A "removing request" (conveying-out request) is a request sent from the exposure apparatus 100 to the coating and developing apparatus 200, requesting the second conveyer 15 to remove the wafer from the carrying-out portion 13b of the inlet/outlet station 13. A supplying request and a removing request are given by outputting a state signal indicating that the exposure apparatus 100 has reached a specific state. The supplying request signal is equivalent to a state signal indicating the corresponding state. A removing request signal is equivalent to a state signal indicating the corresponding state.

A "stop instruction" is an instruction sent from the exposure apparatus 100 to the coating and developing apparatus 200. The "stop instruction" is an instruction instructing to stop a process concerning conveyance of the wafer, which is performed by the coating and developing apparatus 200 in response to a "supplying request" or "removing request", that is, instructing the second conveyer 15 to stop the hand. The stop instruction is given by outputting (activating) a stop instruction signal.

A "signal" can be transmitted between the exposure apparatus 100 and coating and developing apparatus 200 by changing the logic level of a dedicated signal line as well as by transferring data through one or a plurality of signal lines.

Figure 3B:
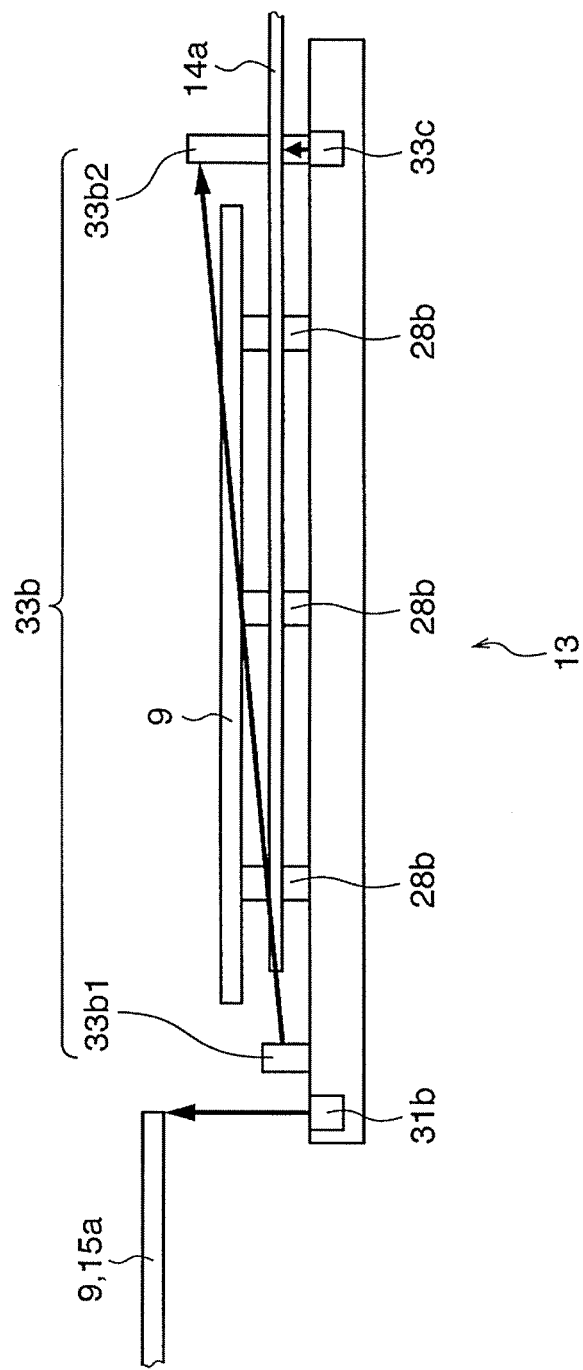
FIG. 3B is a side view showing an arrangement of a carrying-out portion in the inlet/outlet station.

The inlet/outlet station 13 includes the carrying-in portion 13a and carrying-out portion 13b. FIGS. 3A and 3B are side views showing the arrangements of the carrying-in portion 13a and carrying-out portion 13b, respectively.

Supports 28a and 28b for supporting a wafer are respectively provided in the carrying-in portion 13a and carrying-out portion 13b, respectively. Both the supports 28a and 28b can include, for example, three pins that support the wafer from below.

Conveyance (carrying-in) of the wafer from the coating and developing apparatus 200 to the exposure apparatus 100 is performed in the following manner. The second conveyer 15 holds the wafer 9 with the hand 15a and conveys the wafer 9 to the supports 28a so the supports 28a support the wafer 9. Subsequently, using the hand 14a, the first conveyer 14 holds the wafer 9 supported by the supports 28a and conveys the wafer 9 to the stage device 20 of the exposure apparatus 100.

Conveyance (carrying-out) of the wafer from the exposure apparatus 100 to the coating and developing apparatus 200 is performed in the following manner. The first conveyer 14 holds the wafer 9 with the hand 14a and conveys the wafer 9 to the supports 28b so the supports 28b support the wafer 9. Subsequently, using the hand 15a, the second conveyer 15 holds the wafer 9 supported by the supports 28b and conveys the wafer 9 to the coating and developing apparatus unit (not shown) of the coating and developing apparatus.

Namely, in conveyance (carrying-in) of the wafer 9 from the coating and developing apparatus 200 to the exposure apparatus 100 and conveyance (carrying-out) of the wafer 9 from the exposure apparatus 100 to the coating and developing apparatus 200 alike, a conveying process accompanying operation of moving the hand 15a of the second conveyer 15 closer to the supports 28a or 28b takes place.

An entrance detection sensor 31a and wafer detection sensor (object detection sensor) 33a are arranged in the carrying-in portion 13a. The entrance detection sensor 31a detects that the hand 15a of the second conveyer 15, or the wafer 9 held by the hand 15a, which is moving to the carrying-in portion 13a, has entered the detection region of the entrance detection sensor 31a. The wafer detection sensor 33a detects the wafer 9 supported by the supports 28a serving to support the wafer. The first conveyer controller 21 drives the entrance detection sensor 31a and wafer detection sensor 33a. Power supplied from the sub-power supply 24 to the first conveyer controller 21 drives the entrance detection sensor 31a and wafer detection sensor 33a. The wafer detection sensor 33a can comprise a photointerrupter including, for example, a light-projecting unit 33a1 and light-receiving unit 33a2.

An entrance detection sensor 31b, wafer detection sensor (object detection sensor) 33b, and non-retreat detection sensor 33c are arranged in the carrying-out portion 13b. The entrance detection sensor 31b detects that the hand 15a of the second conveyer 15 has entered the detection region of the entrance detection sensor 31b. The wafer detection sensor 33b detects the wafer 9 supported by the supports 28b serving to support the wafer. The non-retreat detection sensor 33c detects that the hand 14a of the first conveyer 14 has not retreated from the supports 28a. The second conveyer controller 22 drives the entrance detection sensor 31b, wafer detection sensor 33b, and non-retreat detection sensor 33c. Power supplied from the sub-power supply 26 to the second conveyer controller 22 drives the entrance detection sensor 31b, wafer detection sensor 33b, and non-retreat detection sensor 33c. The wafer detection sensor 33b can comprise a photointerrupter including, for example, a light-projecting unit 33b1 and light-receiving unit 33b2.

Figure 4:
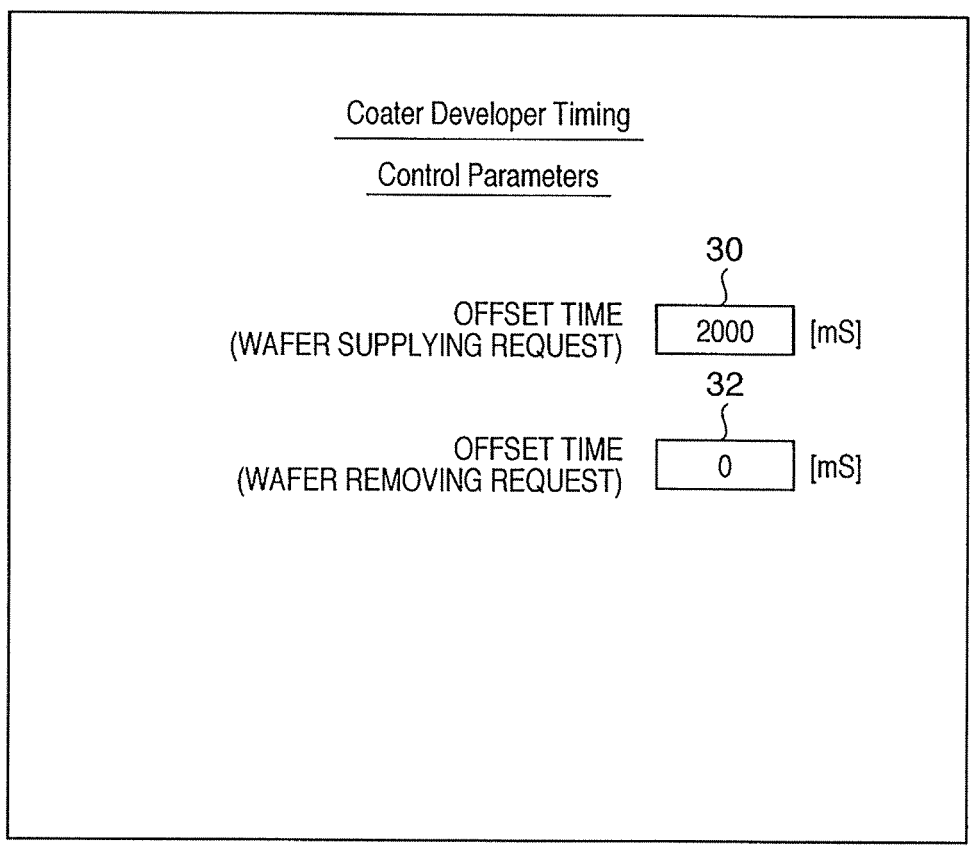
FIG. 4 is a view showing an example of the display content of an input/output device serving as a user interface.

FIG. 4 is a view showing an example of the display content of the input/output device 18 serving as a user interface. Parameters displayed on the screen of the input/output device 18 will be described. An input field 30 is a field where an "offset time (wafer supplying request)" is input. The "offset time (wafer supplying request)" means the offset time (TP1 to be described later) of the timing to generate a wafer supplying request signal that the exposure apparatus 100 is to send the coating and developing apparatus 200. The exposure apparatus 100 generates (activates) the wafer supplying request signal (Input-Request) in advance of the natural request timing by the offset time input to the input field 30. The natural request timing means the timing when the exposure apparatus reaches a state where the request may be satisfied at the same timing as the request timing. For example, the timing when the exposure apparatus 100 reaches a state where a wafer may be supplied from the coating and developing apparatus 200 to the carrying-in portion 13a of the inlet/outlet station 13 is the natural request timing of the supplying request signal. When the offset time input to the input field 30 is 0, the wafer supplying request signal (Input-Request) is generated at the natural request timing.

An input field 32 is a field where an "offset time (wafer removing request)" is input. The "offset time (wafer removing request)" means the offset time (TP2 to be described later) of the timing to generate a wafer removing request signal that the exposure apparatus 100 is to send to the coating and developing apparatus 200. The exposure apparatus 100 generates (activates) the wafer removing request signal (Wafer-Out) in advance of the natural request timing by the offset time input to the input field 32. The natural request timing means the timing when the exposure apparatus reaches a state where the request may be satisfied at the same timing as the request timing, as described above. For example, the timing when the exposure apparatus 100 reaches a state where the coating and developing apparatus 200 may remove a wafer from the carrying-out portion 13b of the inlet/outlet station 13 is the natural request timing of the removing request signal. When the offset time input to the input field 32 is 0, the wafer removing request signal (Wafer-Out) is output at the natural request timing.

In the following description, the mode in which the wafer supplying request signal (Input-Request) or the wafer removing request signal (Wafer-Out) is output in advance of the natural timing will be called an output-advancing mode, and the mode in which such a signal is output at the natural timing will be called a normal mode.

FIGS. 5A and 5B are timing charts showing operation examples when carrying in a wafer from the coating and developing apparatus 200 to the exposure apparatus 100, in which FIG. 5A shows an operation example in the normal mode, and FIG. 5B shows an operation example in the output-advancing mode. Signals shown in FIGS. 5A and 5B will be explained.

<Wafer Carrying In Operation Signal>

A Wafer Carrying In Operation signal is a state signal in the exposure apparatus 100 and indicates the operation state of the first conveyer 14. When the first conveyer 14 performs a wafer conveying process, the signal is in the In Process state; otherwise, the signal is in the Off state.

<Wafer In Sensor Signal>

A Wafer In Sensor signal is an output signal from the wafer detection sensor 33a which detects the presence/absence of a wafer at the carrying-in portion 13a of the inlet/outlet station 13, and is supplied to the first conveyer controller 21. When a wafer is present, the signal is in the Exist state; otherwise, the signal is in the None state.

<Input-Request Signal>

An Input-Request signal is a wafer supplying request signal (state signal indicating a state in which supply of a wafer is requested) which is supplied from the first conveyer controller 21 to the second conveyer controller 22. The wafer supplying request signal is a signal sent from the exposure apparatus 100 requesting the coating and developing apparatus 200 to supply a wafer to the carrying-in portion 13a of the inlet/outlet station 13 by the second conveyer 15. When supply of a wafer is requested, the signal is in the Request state; otherwise, the signal is in the NotReady state.

<Wafer Supply Signal>

A Wafer Supply signal is a signal supplied from the second conveyer controller 22 to the first conveyer controller 21. The Wafer Supply signal is set in the Supplied state at a timing when the second conveyer 15 supplies a wafer to the carrying-in portion 13a of the inlet/outlet station 13. When the Input-Request signal changes to the NotReady state, the Wafer Supply signal changes to the NotSupplied state.

FIGS. 6A and 6B are timing charts showing operation examples when carrying out the wafer from the exposure apparatus 100 to the coating and developing apparatus 200, in which FIG. 6A shows an operation example in the normal mode, and FIG. 6B shows an operation example in the output-advancing mode. Signals shown in FIGS. 6A and 6B will be explained.

<Output-Ready Signal>

An Output-Ready signal is a conveyance completion signal supplied from the second conveyer controller 22 to the first conveyer controller 21. The Output-Ready signal is a signal indicating that the coating and developing apparatus 200 has completed preparation for removing the wafer from the carrying-out portion 13b of the inlet/outlet station 13 by the second conveyer 15. The Output-Ready signal changes to the Ready state at a timing when preparation for removing the wafer from the carrying-out portion 13b of the inlet/outlet station 13 by the second conveyer 15 is completed. The Output-Ready signal changes to the NotReady state when the Wafer-Out signal changes to the Placed state.

<Wafer Out Sensor Signal>

A Wafer Out Sensor signal is an output signal from the wafer detection sensor 33b which detects the presence/absence of a wafer at the carrying-out portion 13b of the inlet/outlet station 13. When a wafer is present, the signal is in the Exist state; otherwise, the signal is in the None state.

<Wafer-Out Signal>

A Wafer-Out signal is a wafer removing request signal (a state signal indicating a state in which removal of a wafer is requested) supplied from the first conveyer controller 21 to the second conveyer controller 22. The wafer removing request signal is a signal sent from the exposure apparatus 100 requesting the coating and developing apparatus 200 to remove the wafer from the carrying-out portion 13b of the inlet/outlet station 13 by the second conveyer 15. When a wafer is arranged at the carrying-out portion 13b of the inlet/outlet station 13, the signal is in the Request state; otherwise, the signal is in the NotReady state.

<Wafer Carrying Out Operation Signal>

A Wafer Carrying Out Operation signal is a state signal in the coating and developing apparatus 200 and indicates the operation state of the second conveyer 15. When the second conveyer 15 performs a conveyance process, the signal is in the In Process state; otherwise, the signal is in the Off state.

Figure 7:
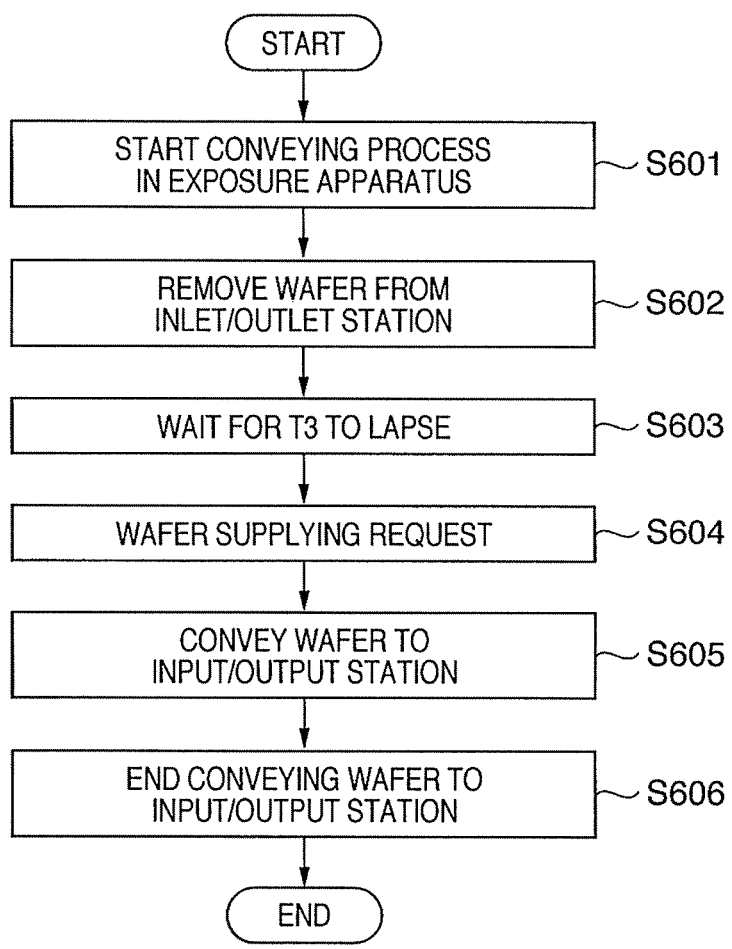
FIG. 7 is a flowchart showing an operation example when carrying in the wafer from the coating and developing apparatus to the exposure apparatus in a normal mode.

FIG. 7 is a flowchart showing an operation example when carrying in the wafer from the coating and developing apparatus 200 to the exposure apparatus 100 in the normal mode.

In S601, in response to an instruction from the exposure apparatus controller 16 to the first conveyer controller 21, the conveyance process of the first conveyer 14 is started. More specifically, the hand 14a of the first conveyer 14 starts moving toward the carrying-in portion 13a of the inlet/outlet station 13. This timing corresponds to t1 in FIG. 5A.

In S602, in response to an instruction from the exposure apparatus controller 16 to the first conveyer controller 21, using the hand 14a, the first conveyer 14 holds a wafer at the carrying-in portion 13a of the inlet/outlet station 13, removes the wafer from the carrying-in portion 13a, and moves it to the stage device 20. At this time, the Wafer In Sensor signal as an output from the wafer detection sensor 33a changes from the Exist state to the None state. This timing corresponds to t2 in FIG. 5A.

In S603, the exposure apparatus controller 16 waits for a time T3 to elapse until the hand 14a of the first conveyer 14 retreats to a safe region.

In S604, in response to an instruction from the exposure apparatus controller 16 to the first conveyer controller 21, the first conveyer controller 21 changes the wafer carrying-in request signal (Input-Request) from the NotReady state to the Request state. This timing corresponds to t3 in FIG. 5A.

In S605, in response to an instruction from the coating and developing apparatus controller 17 to the second conveyer controller 22, the coating and developing apparatus 200 starts conveying the wafer to the carrying-in portion 13a of the inlet/outlet station 13.

The time T2 in FIG. 5A is the time taken until the hand 15a of the second conveyer 15 reaches the carrying-in portion 13a of the inlet/outlet station 13. During the time T2, the hand 15a of the second conveyer 15 does not enter the inlet/outlet station 13.

In S606, at a timing when the time T1 elapses since the timing when the Input-Request signal is changed from the NotReady state to the Request state, the second conveyer 15 arranges the wafer on the carrying-in portion 13a of the inlet/outlet station 13. At this timing, in response to an instruction from the coating and developing apparatus controller 17 to the second conveyer controller 22, the second conveyer controller 22 changes the Wafer Supply signal from the NotSupplied state to the Supplied state. This timing corresponds to t4 in FIG. 5A. A time T6 in FIG. 5A is the time taken since the hand 15a of the second conveyer 15 enters the carrying-in portion 13a of the inlet/outlet station 13 until the supports 28a of the carrying-in portion 13a support the wafer.

Figure 8:
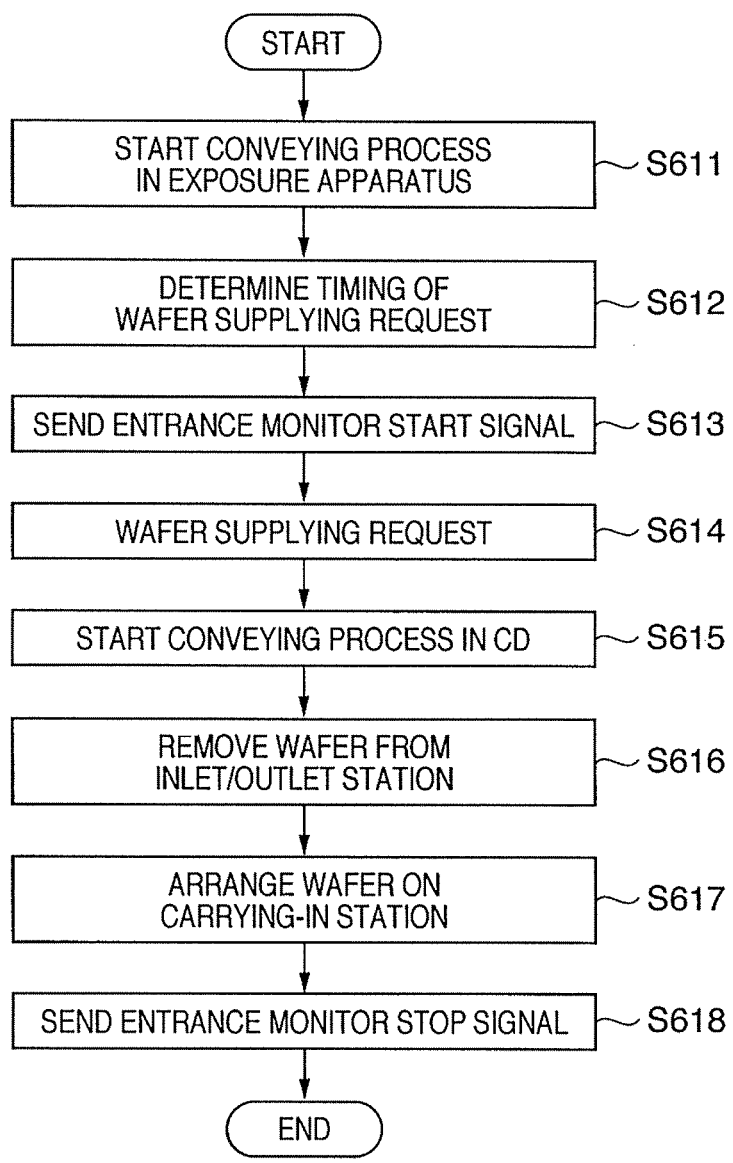
FIG. 8 is a flowchart showing an operation example when carrying in the wafer from the coating and developing apparatus to the exposure apparatus in an output-advancing mode.

FIG. 8 is a flowchart showing an operation example when carrying in the wafer from the coating and developing apparatus 200 to the exposure apparatus 100 in the output-advancing mode.

In S611, in response to an instruction from the exposure apparatus controller 16 to the first conveyer controller 21, the first conveyer controller 21 causes the first conveyer 14 to start a conveying process. More specifically, the hand 14a of the first conveyer 14 starts moving toward the carrying-in portion 13a of the inlet/outlet station 13.

In S612, the exposure apparatus controller 16 calculates a timing t11 when the wafer supplying request signal (input-Request) is changed from the NotReady state to the Request state. In the output-advancing mode, the timing when the wafer supplying request signal (Input-Request) is changed from the NotReady state to the Request state is output in advance of the natural timing by a time TP1. FIG. 5B shows a case wherein the time TP1 takes a maximum value TP1max (TP1max=T1−T6). The time TP1 can be input to the input field 30 within the range of 0≤TP1≤TP1max.

TP1max will be explained. The exposure apparatus controller 16 recognizes in advance a time T5 taken since the timing (t1) when the hand 14a of the first conveyer 14 starts moving toward the inlet/outlet station 13 until the hand 14a holds the wafer at the carrying-in portion 13a and removes it from the carrying-in portion 13a.

TP1max is expressed as (T2−T3). If TP1max (TP1) is larger than (T2−T3), the hand 15a of the second conveyer 15 may enter the carrying-in portion 13a of the inlet/outlet station 13 before the hand 14a of the first conveyer 14 retreats to the safe region, and collide against each other.

The exposure apparatus controller 16 calculates the timing t11 when the wafer supplying request signal (Input-Request) is changed from the NotReady state to the Request state in accordance with equation (1):

$$t11 = t1 + T5 + T3 - TP1 \qquad (1)$$

In this example, the timing t11 is calculated after the start of the conveying process (S611). Alternatively, the timing t11 may be calculated before the start of the conveyance process (S611).

In S613, the exposure apparatus controller 16 activates a monitor state signal supplied to the first conveyer controller 21 to a monitor state (high level).

In S614, in response to an instruction from the exposure apparatus controller 16 to the first conveyer controller 21, the first conveyer controller 21 changes the wafer supplying request signal (Input-Request) from the NotReady state to the Request state.

In S615, in response to an instruction from the coating and developing apparatus controller 17 to the second conveyer controller 22, the second conveyer controller 22 causes the second conveyer 15 to start a wafer conveyance process. More specifically, the second conveyer 15 starts a process of conveying the wafer to the carrying-in portion 13a of the inlet/outlet station 13. Simultaneously with this process, the first conveyer 14 continues the process of conveying the wafer at the carrying-in portion 13a of the inlet/outlet station 13 to the stage device 20.

In S616, using the hand 14a, the first conveyer 14 holds the wafer at the carrying-in portion 13a of the inlet/outlet station 13, removes the wafer from the carrying-in portion 13a, and starts moving toward the stage device 20. At this time, the Wafer In Sensor signal changes from the Exist state to the None state. This timing corresponds to t2 in FIG. 5B.

In S617, at the timing when the time T1 elapses since the timing when the Input-Request signal changes from the NotReady state to the Request state, the second conveyer 15 arranges the wafer on the carrying-in portion 13a of the inlet/outlet station 13. At this time, in response to an instruction from the coating and developing apparatus controller 17 to the second conveyer controller 22, the second conveyer controller 22 changes the Wafer Supply signal from the NotSupplied state to the Supplied state. This timing corresponds to t12 in FIG. 5B.

By generating the wafer supplying request signal (Input-Request) in advance of the natural timing by the advancing time TP1, the timing when the coating and developing apparatus 200 supplies the wafer to the carrying-in portion 13a of the inlet/outlet station 13 is advanced by TP1.

In S618, the exposure apparatus controller 16 inactivates the monitor state signal supplied to the first conveyer controller 21 to the non-monitor state (low level).

The above process is repeated for the number of wafers to be processed continuously.

Figure 9:
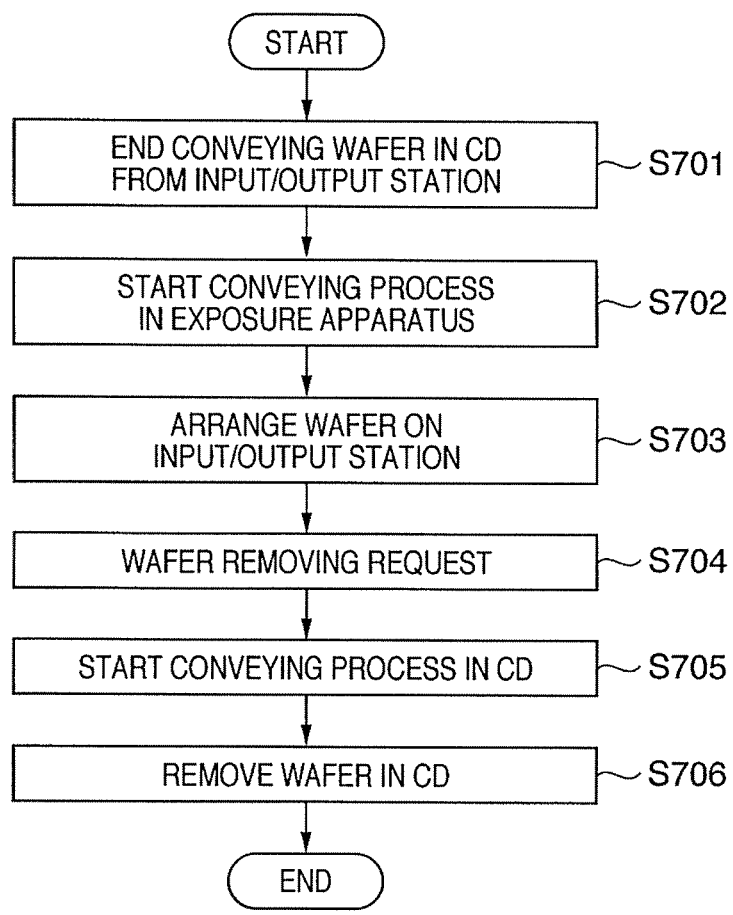
FIG. 9 is a flowchart showing an operation example when carrying out the wafer from the exposure apparatus to the coating and developing apparatus in the normal mode.

FIG. 9 is a flowchart showing an operation example when carrying out the wafer from the exposure apparatus 100 to the coating and developing apparatus 200 in the normal mode.

In S701, at the timing when the conveying process of the second conveyer 15 completes removing the wafer from the carrying-out portion 13b of the inlet/outlet station 13 and conveying the wafer to the developing unit, the second conveyer controller 22 changes the conveyance completion signal (Output-Ready). More specifically, at this timing, the second conveyer controller 22 changes the conveyance completion signal (Output-Ready) from the NotReady state to the Ready state. This timing corresponds to t21 in FIG. 6A.

In S702, in response to an instruction from the exposure apparatus controller 16 to the first conveyer controller 21, the conveying process of the first conveyer 14 of conveying the wafer from the carrying-out portion 13b of the inlet/outlet station 13 is started.

In S703, the first conveyer 14 completes arranging the wafer on the carrying-out portion 13b of the inlet/outlet station 13. At this timing, the output signal (Wafer Out Sensor) from the wafer detection sensor 33b changes from the None state to the Exist state. This timing corresponds to t22 in FIGS. 6A and 6B.

In S704, the exposure apparatus controller 16 waits until a time Ta elapses since timing t21. After that, in response to an instruction from the exposure apparatus controller 16 to the first conveyer controller 21, the first conveyer controller 21 changes the wafer removing request signal (Wafer-Out) from the NotReady state to the Request state. This timing corresponds to t23 in FIGS. 6A and 6B. In FIGS. 6A and 6B, a time Te is the time taken since the output signal (Wafer Out Sensor) from the wafer detection sensor 33b changes from the None state to the Exist state until the hand 14a of the first conveyer 14 retreats to the safe region.

In S705, in response to an instruction from the coating and developing apparatus controller 17 to the second conveyer controller 22, the second conveyer 15 starts a wafer conveying process. More specifically, the hand 15a of the second conveyer 15 starts moving to the carrying-out portion 13b of the inlet/outlet station 13.

A time Tb in FIG. 6A is the time taken until the hand 15a of the second conveyer 15 reaches the carrying-out portion 13b of the inlet/outlet station 13. During the time Tb, the hand 15a of the second conveyer 15 does not enter the inlet/outlet station 13.

In S706, using the hand 15a, the second conveyer 15 removes the wafer from the carrying-out portion 13b of the inlet/outlet station 13. Thus, the output signal (Wafer Out Sensor) from the wafer detection sensor 33b changes from the Exit state to the None state.

Figure 10:
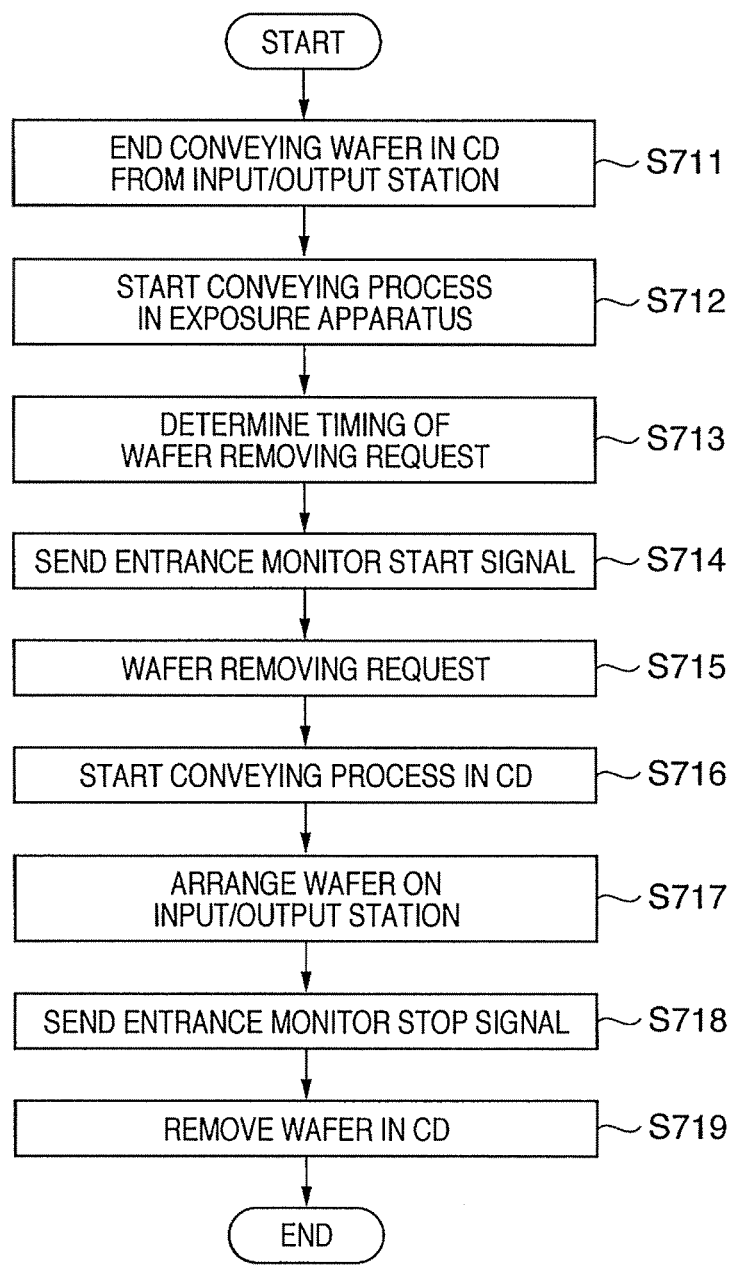
FIG. 10 is a flowchart showing an operation example when carrying out the wafer from the exposure apparatus to the coating and developing apparatus in the output-advancing mode.

FIG. 10 is a flowchart showing an operation example when carrying out the wafer from the exposure apparatus 100 to the coating and developing apparatus 200 in the output-advancing mode.

In S711, at the timing when the conveyance process of the second conveyer 15 completes removing the wafer from the carrying-out portion 13b of the inlet/outlet station 13 and conveying the wafer to the developing unit using the hand 15a, the second conveyer controller 22 changes the conveyance completion signal (Output-Ready). More specifically, at this timing, the second conveyer controller 22 changes the conveyance completion signal (Out-Ready) from the NotReady state to the Ready state. This timing corresponds to t21 in FIGS. 6A and 6B.

In S712, in response to an instruction from the exposure apparatus controller 16 to the first conveyer controller 21, the process of the first conveyer 14 of conveying the wafer to the carrying-out portion 13b of the inlet/outlet station 13 is started.

In S713, the exposure apparatus controller 16 calculates the timing when the wafer removing request signal (Wafer-Out) is changed from the NotReady state to the Request state. At this time, in the output-advancing mode, the timing when the wafer removing request signal (Wafer-Out) is changed from the NotReady state to the Request state is advanced of the natural timing by the time TP2. FIG. 6B shows a case wherein the time TP2 takes a maximum value TP2max (TP2max=Tb). The time TP2 can be input to the input field 32 within the range of 0≤TP2≤TP2max.

TP2max will be explained. The time Tb is the time taken until the hand 15a of the second conveyer 15 reaches the carrying-out portion 13b of the inlet/outlet station 13. During the time Tb, the hand 15a of the second conveyer 15 does not enter the inlet/outlet station 13. If TP2max (TP2) is larger than Tb, the hand 15a of the second conveyer 15 may enter the inlet/outlet station 13 before the hand 14a of the first conveyer 14 retreats to the safe region, and collide against the hand 14a.

The exposure apparatus 100 recognizes in advance, as performance information, the time Ta taken since the timing t21 when the hand 14a of the first conveyer 14 starts moving toward the carrying-out portion 13b of the inlet/outlet station 13 until the hand 14a arranges the wafer on the carrying-out portion 13b.

The exposure apparatus controller 16 calculates the timing when the wafer removing request signal (Wafer-Out) is changed from the NotReady state to the Request state in accordance with equation (2):

$$t24=t21+Ta-TP2 \qquad (2)$$

In this example, the timing t24 is calculated after the start of the conveyance process (S712).
Alternatively, the timing t24 may be calculated before the start of the conveyance process (S712).

In S714, the exposure apparatus controller 16 activates the monitor state signal supplied to the first conveyer controller 21 to the monitor state (high level).

In S715, in response to an instruction from the exposure apparatus controller 16 to the first conveyer controller 21, the first conveyer controller 21 changes the wafer removing request signal (Wafer-Out) from the NotReady state to the Request state.

In S716, in response to an instruction from the coating and developing apparatus controller 17 to the second conveyer controller 22, the second conveyer 15 starts a wafer conveyance process. More specifically, the hand 15a of the second conveyer 15 starts moving to the carrying-out portion 13b of the inlet/outlet station 13.

In S717, at a lapse of the time Ta since the timing t21, the first conveyer 14 completes arranging the wafer at the carrying-out portion 13b of the inlet/outlet station 13.

In S718, the exposure apparatus controller 16 inactivates the monitor state signal supplied to the first conveyer controller 21 to the non-monitor state (low level).

In S719, using the hand 15a, the second conveyer 15 removes the wafer from the carrying-out portion 13b of the inlet/outlet station 13. Thus, the output signal (Wafer Out Sensor) of the wafer detection sensor 33b changes from the Exit state to the None state.

By generating the wafer removing request signal (Wafer-Out) in advance of the natural timing by the advancing time TP2, the timing when the coating and developing apparatus 200 removes the wafer from the carrying-out portion 13b of the inlet/outlet station 13 is advanced by TP2.

The above process is repeated by the number of wafers to be processed continuously.

Figure 11:
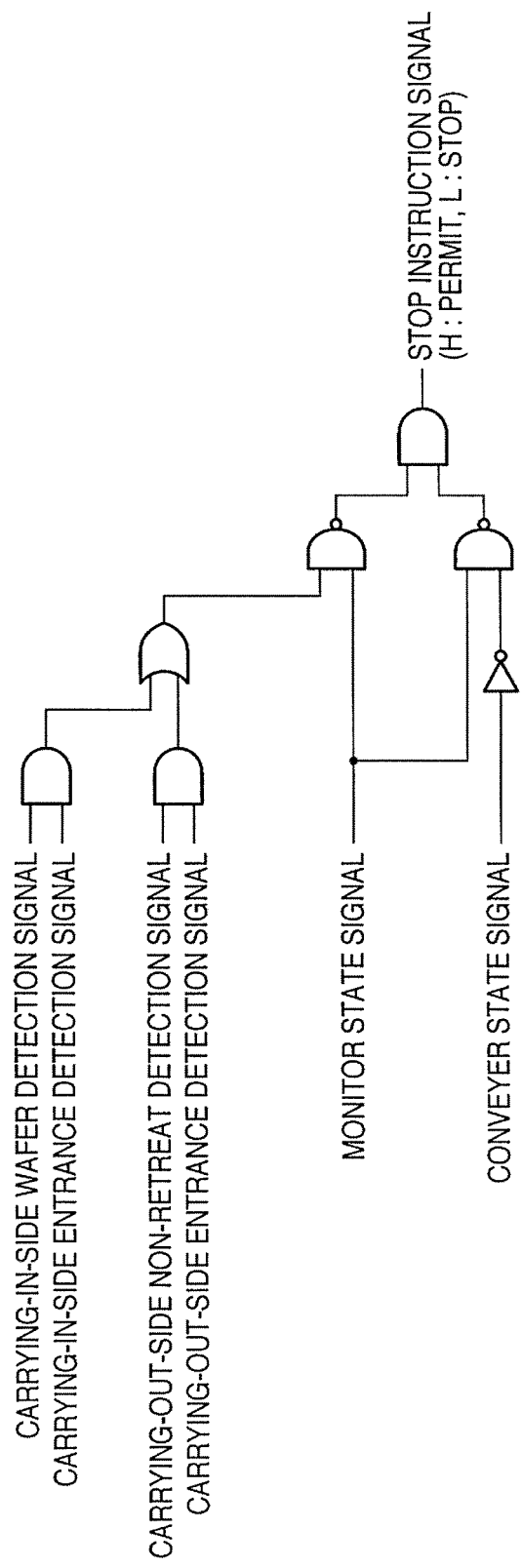
FIG. 11 is a diagram showing an example of a logic circuit to be built in a conveyer controller in the exposure apparatus.

FIG. 11 is a diagram showing an example of a logic circuit to be built in the first conveyer controller 21 of the exposure apparatus 100. Signals shown in FIG. 11 will be explained.

<Carrying-In-Side Wafer Detection Signal>

A carrying-in-side wafer detection signal is the output signal from the wafer detection sensor 33a provided to the carrying-in portion 13a. A high- and low-level carrying-in-side wafer detection signals respectively indicate that a wafer exists and does not.

<Carrying-In-Side Entrance Detection signal>

A carrying-in-side entrance detection signal is the output signal from the entrance detection sensor 31a provided to the carrying-in portion 13a. A high- and low-level carrying-in-side entrance detection signals respectively indicate that the hand 15a of the second conveyer 15 has and has not entered the carrying-in portion 13a.

<Carrying-Out-Side Non-Retreat Detection Signal>

A carrying-out-side non-retreat detection signal is the output signal from the non-retreat detection sensor 33c provided to the carrying-out portion 13b. A high- and low-level carrying-out-side non-retreat detection signals respectively indicate that the hand 14a of the first conveyer 14 has not and has retreated from the supports 28b.

<Carrying-Out-Side Entrance Detection Signal>

A carrying-out-side entrance detection signal is the output signal from the entrance detection sensor 31b provided to the carrying-out portion 13b. A high- and low-level carrying-out-side entrance detection signals respectively indicate that the hand 15a of the second conveyer 15 has and has not entered the carrying-out portion 13b.

<Monitor State Signal>

A monitor state signal is the signal the logic level of which is controlled by the exposure apparatus controller 16. A high- and low-level monitor state signals respectively indicate a state where the operation of the second conveyer 15 should be monitored (monitor state) and a state where it need not (non-monitor state).

<conveyer State Signal>

A conveyer state signal is a signal indicating the state of the first conveyer 14 and second conveyer 15. When the conveyer state signal is at high level, it indicates that both the first and second conveyers 14 and 15 are normal. If the conveyer state signal is at low level, it indicates that at least one of the first and second conveyers 14 and 15 is in an abnormal state. The first conveyer controller 21 which controls the first conveyer 14 can determine the state (normal/abnormal) of the first conveyer 14. The first conveyer controller 21 can determine the state (normal/abnormal) of the first conveyer 14 based on, for example, an output from an encoder indicating the position of the hand 14a. The second conveyer controller 22 which controls the second conveyer 15 can determine the state (normal/abnormal) of the second conveyer 15, and the first conveyer controller 21 is informed of the determination result. The second conveyer controller 22 can determine the state (normal/abnormal) of the second conveyer 15 based on, for example, an output from an encoder indicating the position of the hand 15a.

<Stop Instruction Signal>

A stop instruction signal is a signal that the first conveyer controller 21 of the exposure apparatus 100 sends to the second conveyer controller 22 of the coating and developing apparatus 200. When the stop instruction signal is at high level, it indicates that it permits the second conveyer controller 22 to operate the second conveyer 15 (that is, to move the hand 15a). When the stop instruction signal is at low level, it instructs the second conveyer controller 22 to inhibit operation of the second conveyer 15, that is, it indicates that the second conveyer controller 22 should stop the hand 15a of the second conveyer 15.

As is apparent from the arrangement shown in FIG. 11, the stop instruction signal goes to low level in the following cases. The first conveyer controller 21 accordingly sends to the second conveyer controller 22 a stop instruction to stop the operation of the second conveyer 15 (that is, the operation of the hand 15a):

(1) when all of the carrying-in-side wafer detection signal, carrying-in-side entrance detection signal, and monitor state signal are at high level (regardless of the state of any other signal),
(2) when all of the carrying-out-side non-retreat detection signal, carrying-out-side entrance detection signal, and monitor state signal are at high level (regardless of the state of any other signal), or
(3) when the conveyer state signal is at low level and the monitor state signal is at high level (regardless of the state of any other signal).

When the stop instruction signal is at low level, the first conveyer controller 21 of the exposure apparatus 100 shown in FIG. 1 sends a stop instruction to the second conveyer controller 22 of the coating and developing apparatus 200. When power supply from the sub-power supply 24 to the first conveyer controller 21 is interrupted, the stop instruction signal goes to low level. Therefore, when power supply from the sub-power supply 24 to the first conveyer controller 21 is interrupted, a stop instruction is sent to the second conveyer controller 22 of the coating and developing apparatus 200, so the second conveyer controller 22 stops the second conveyer 15. This avoids collision of the hand 14a or the wafer of the first conveyer 14 with the hand 15a or the wafer of the second conveyer 15 even when the power is withdrawn.

In the above embodiment, the present invention is applied to the transfer of the wafer between the exposure apparatus and coating and developing apparatus. However, the present invention is not limited to this. More specifically, the present invention can be widely applied to the transfer of an object between a processing apparatus including a processing unit which processes an object, and an external apparatus. The above exposure apparatus is an example of the processing apparatus, and the above coating and developing apparatus is an example of the external apparatus.

The controller described in the claims is exemplified by, for example, the first conveyer controller 21, or a combination of the first conveyer controller 21 and exposure apparatus controller 16.

As described above, according to a preferred embodiment of the present invention, a processing apparatus including a processing unit which processes an object comprises a first conveyer and a controller. The first conveyer conveys the object between a support arranged between an external apparatus and the processing unit, and the processing unit. The controller outputs a state signal and a stop instruction signal. The state signal is a signal indicating that the processing apparatus has reached a specific state, and is output before the processing apparatus reaches the specific state. The external apparatus comprises a second conveyer which conveys the object by holding it with a hand, and starts a conveyance process, accompanying operation of moving the hand closer to the support, in response to the state signal. This advances the timing when the external apparatus transfers the object to the processing apparatus, and/or the timing when the external apparatus receives the object from the processing apparatus, thus improving the throughput. Furthermore, when the controller of the processing apparatus outputs to the external apparatus a stop instruction signal which instructs the external apparatus to stop the hand, it can stop the hand of the second conveying apparatus on the external apparatus side. Hence, when an abnormality or inconvenience occurs, collision of the hand or object of the second conveying apparatus with the hand or object of the first conveyer on the processing apparatus side can be avoided.

The sub-power supplies drive the first conveyer controller 21 and second conveyer controller 22. Even if the power supply from the main power supply is interrupted, the first and second conveyers 14 and 15 can be controlled, avoiding collision of the hand or object.

The circuit which generates the stop instruction signal comprises logic circuits as shown in FIG. 1. Thus, the conveying apparatuses can be stopped without being adversely affected by a trouble in the software, or an uncontrollable error, a malfunction, a reset process, or the like of the computer.

A device manufacturing method which utilizes the above exposure apparatus or lithography system will be described. FIG. 12 is a flowchart showing the procedure of an overall semiconductor device manufacturing process. In step 1 (circuit design), the circuit of a semiconductor device is designed. In step 2 (reticle fabrication), a reticle (called also a mask) is fabricated based on the designed circuit pattern. In step 3 (wafer manufacture), a wafer (also called a substrate) is manufactured using a material such as silicon. In step 4 (wafer process) called a preprocess, an actual circuit is formed on the wafer by lithography using the above reticle and wafer. In the next step 5 (assembly) called a post-process, a semiconductor chip is formed using the wafer fabricated in step 4. This step includes processes such as assembly (dicing and bonding) and packaging (chip encapsulation). In step 6 (inspection), inspections including operation check test and durability test of the semiconductor device fabricated in step 5 are performed. A semiconductor device is finished with these steps and shipped (step 7).

Figure 13:
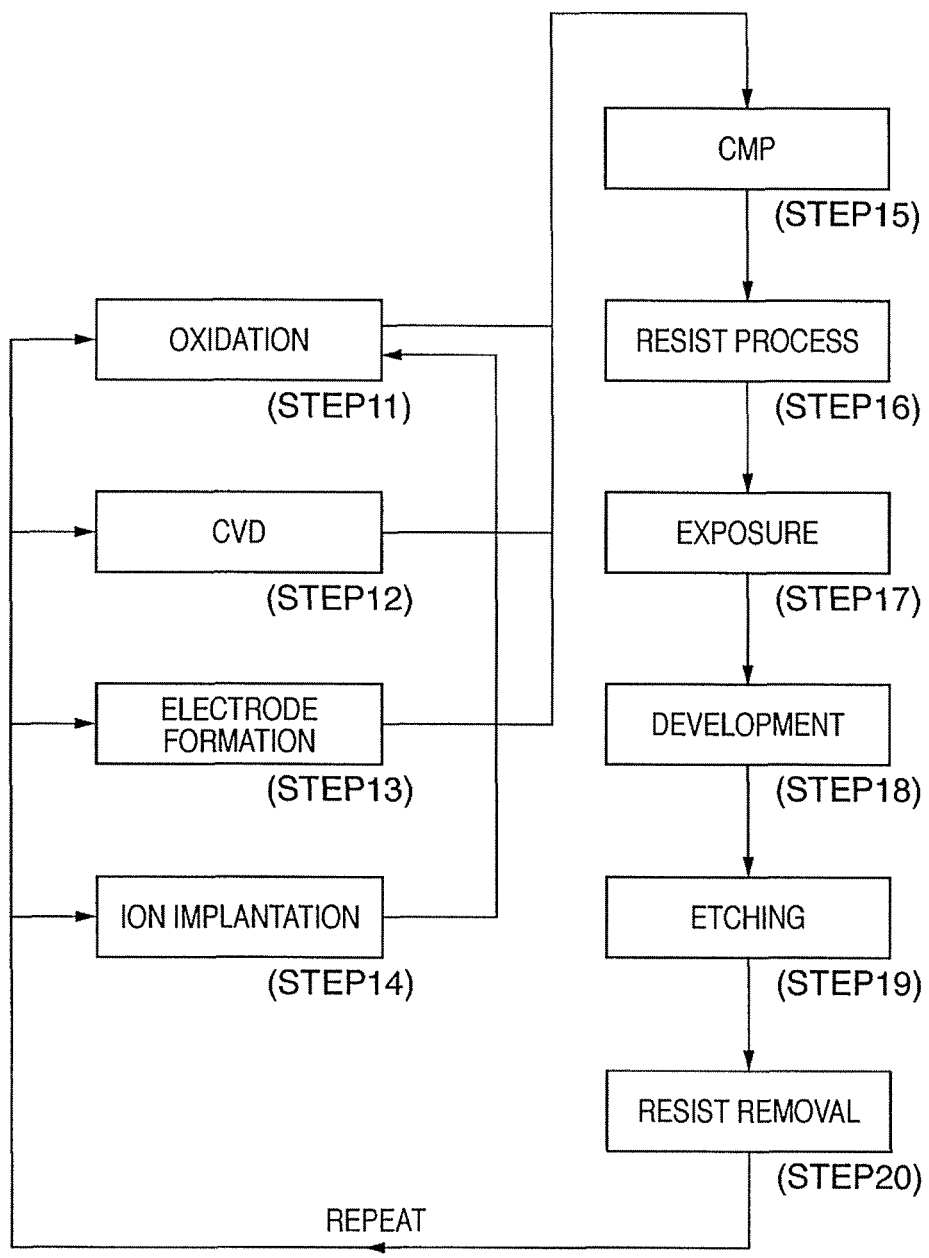
FIG. 13 is a flowchart showing the detailed procedure of a wafer process.

FIG. 13 is a flowchart showing the detailed procedure of the above wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (CMP), the insulating film is planarized by CMP. In step 16 (resist process), the coating and developing apparatus of the lithography system applies a photosensitive agent to the wafer. In step 17 (exposure), the exposure apparatus of the lithography system exposes the wafer coated with the photosensitive agent through a mask formed with the circuit pattern, to form a latent image pattern on the resist. In step 18 (development), the coating and developing apparatus of the lithography system develops the latent image pattern formed on the resist on the wafer to form a physical resist pattern. In step 19 (etching), a layer or substrate underlying the resist pattern is etched through an opening in the resist pattern. In step 20 (resist removal), any unnecessary resist after etching is removed. By repeating these steps, multiple circuit patterns are formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-340577, filed Dec. 18, 2006, which is hereby incorporated by reference herein in its entirety.

What is claimed is:

1. A processing apparatus including a processing unit which processes an object, the apparatus comprising:
a first conveyer configured to hold the object with a first hand included therein and to perform conveyance of the object between the processing unit and a station arranged between an external apparatus, which is separate from the processing apparatus, and the processing unit, the external apparatus including: (a) a second conveyer configured to hold the object with a second hand included therein and to perform conveyance of the object to the station or from the station, and (b) a second controller configured to control the conveyance by the second conveyer; and a first controller configured to output a request signal and a stop instruction signal to the second controller, wherein the request signal is a signal for requesting the external apparatus to perform the conveyance by the second conveyer, and is output before the first hand reaches a first position, where a collision of the first hand or the object held by the first hand with the second hand or the object held by the second hand can be avoided, from a second position where the collision cannot be avoided, the processing apparatus comprising an interface via which a preset time is changeable, the first controller outputting the request signal at the preset time before an estimated time for the first hand to reach the first position, and wherein the stop instruction signal is a signal which instructs the external apparatus to stop the second hand, the first controller being configured to output the stop instruction signal, if it is determined, based on a state of the processing apparatus after an output of the request signal, that the collision may occur because the first hand is at the second position.

2. An apparatus according to claim 1, wherein the stop instruction signal is output in a state where unloading of the object from the station by the first conveyer is not completed.

3. An apparatus according to claim 1, wherein the stop instruction signal is output in a state where loading of the object to the station by the first conveyer is not completed.

4. An apparatus according to claim 1, further comprising an object detection sensor configured to detect that the object is placed on the station, and an entrance detection sensor configured to detect that one of the second hand and the object held by the second hand has entered a predetermined region associated with the station, wherein the first controller is configured to output the stop instruction signal based on outputs from the object detection sensor and the entrance detection sensor.

5. An apparatus according to claim 1, further comprising a non-retreat detection sensor configured to detect that the first hand has not retreated to a predetermined region away from the station, and an entrance detection sensor which detects that one of the second hand and the object held by the second hand has entered a predetermined region associated with the station, wherein the first controller is configured to output the stop instruction signal based on outputs from the non-retreat detection sensor and the entrance detection sensor.

6. An apparatus according to claim 1, wherein the processing unit is configured to expose a substrate as the object to radiant energy.

7. An apparatus according to claim 6, wherein the request signal comprises a signal which requests the external apparatus to perform the conveyance of the substrate to the station by the second conveyer.

8. An apparatus according to claim 6, wherein the request signal comprises a signal which requests the external apparatus to perform the conveyance of the substrate from the station by the second conveyer.

9. A method of manufacturing a device, the method comprising:
exposing a substrate to radiant energy using the processing apparatus defined in claim 6;
developing the exposed substrate; and
processing the developed substrate to manufacture the device.

10. An apparatus according to claim 1, wherein the interface is a user interface via which information of the preset time is input.

11. An apparatus according to claim 1, wherein the first controller is configured to output a signal to the second controller by changing a logic level of a signal line.

12. A processing apparatus including a processing unit which processes an object, the apparatus comprising:
a first conveyer configured to perform conveyance of the object between the processing unit and a support arranged at a position between an external apparatus, which is separate from the processing apparatus, and the processing unit; and
a controller configured to output a state signal and a stop instruction signal,
wherein the external apparatus includes a second conveyer configured to perform conveyance of the object, and to start conveyance of the object to or from the support arranged at the position in response to the state signal,
wherein the state signal is a signal indicating that the processing apparatus has reached a first state of the processing apparatus, in which the conveyance by the second conveyer is enabled, and is output before the processing apparatus reaches the first state from a second state of the processing apparatus, in which the conveyance by the second conveyer is not enabled, the processing apparatus comprising an interface via which a preset time is changeable, the controller outputting the state signal at the preset time before an estimated time for the processing apparatus to reach the first state from the second state, and
wherein the stop instruction signal is a signal which instructs the external apparatus to stop the conveyance, the controller being configured to output the stop instruction signal, if it is determined by the controller, based on a state of the processing apparatus after output of the state signal, that the processing apparatus cannot reach the first state from the second state.

13. An apparatus according to claim 12, wherein the processing unit is configured to expose the object to radiant energy.

14. A method of manufacturing a device, the method comprising:
exposing an object to radiant energy using the processing apparatus defined in claim 13;
developing the exposed object; and
processing the developed object to manufacture the device.

15. An apparatus according to claim 12, wherein the interface is a user interface via which information of the preset time is input.

16. An apparatus according to claim 12, wherein the controller is configured to output a signal to the second controller by changing a logic level of a signal line.

17. A processing apparatus including a processing unit which processes an object, the apparatus comprising:
a first conveyer configured to hold the object with a first hand included therein and to perform conveyance of the object between the processing unit and a station arranged between an external apparatus, which is separate from the processing apparatus, and the processing unit, the external apparatus including: (a) a second conveyer configured to hold the object with a second hand included therein and to perform conveyance of the object to the station or from the station, and (b) a second controller configured to control the conveyance by the second conveyer; and a first controller configured to output a request signal to the second controller, wherein the request signal is a signal for requesting the external apparatus to perform the conveyance by the second conveyer, and is output before the first hand reaches a first position, where a collision of the first hand or the object held by the first hand with the second hand or the object held by the second hand can be avoided, from a second position where the collision cannot be avoided, the processing apparatus comprising an interface via which a preset time is changeable, the first controller outputting the request signal at the preset time before an estimated time for the first hand to reach the first position.

18. A processing apparatus including a processing unit which processes an object, the apparatus comprising:

a first conveyer configured to perform conveyance of the object between the processing unit and a support arranged at a position between an external apparatus, which is separate from the processing apparatus, and the processing unit; and a controller configured to output a state signal, wherein the external apparatus includes a second conveyer configured to perform conveyance of the object, and to start conveyance of the object to or from the support arranged at the position in response to the state signal, and wherein the state signal is a signal indicating that the processing apparatus has reached a first state of the processing apparatus, in which the conveyance by the second conveyer is enabled, and is output before the processing apparatus reaches the first state from a second state of the processing apparatus, in which the conveyance by the second conveyer is not enabled, the processing apparatus comprising an interface via which a preset time is changeable, the controller outputting the state signal at the preset time before an estimated time for the processing apparatus to reach the first state from the second state.

* * * * *